United States Patent [19]

Madan

[11] 4,415,760

[45] Nov. 15, 1983

[54] AMORPHOUS SILICON SOLAR CELLS INCORPORATING AN INSULATING LAYER IN THE BODY OF AMORPHOUS SILICON AND A METHOD OF SUPPRESSING THE BACK DIFFUSION OF HOLES INTO AN N-TYPE REGION

[75] Inventor: Arun Madan, Moraga, Calif.

[73] Assignee: Chevron Research Company, San Francisco, Calif.

[21] Appl. No.: 367,815

[22] Filed: Apr. 12, 1982

[51] Int. Cl.³ .................... H01L 31/06; H01L 31/18
[52] U.S. Cl. .................................. 136/258; 136/255; 357/2; 357/30; 427/39; 427/74; 427/86
[58] Field of Search .......... 136/255, 258 AM; 357/2, 357/15, 30, 59; 427/39, 74, 86

[56] References Cited

FOREIGN PATENT DOCUMENTS 51980 5/1982 European Pat. Off. .... 136/258 AM

OTHER PUBLICATIONS

H. J. Pauwels et al., "Influence of an Insulating Layer on the Efficiency of a Semiconductor-Insulator-Semiconductor (SIS) Heterojunction Solar Cell", *Solid-State Electronics*, vol. 21, pp. 693–698 (1978).

*Primary Examiner*—Aaron Weisstuch
*Attorney, Agent, or Firm*—D. A. Newell; E. J. Keeling; A. Stephen Zavell

[57] ABSTRACT

Hydrogenated amorphous silicon solar cells which incorporate a thin insulating layer between a photoactive layer of intrinsic hydrogenated amorphous silicon and a heavily doped radiation incident N or N+-type layer of hydrogenated amorphous silicon.

16 Claims, 1 Drawing Figure

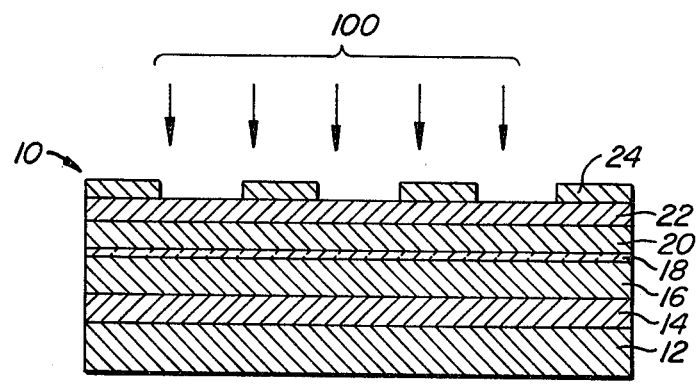
FIG._1.

AMORPHOUS SILICON SOLAR CELLS INCORPORATING AN INSULATING LAYER IN THE BODY OF AMORPHOUS SILICON AND A METHOD OF SUPPRESSING THE BACK DIFFUSION OF HOLES INTO AN N-TYPE REGION

BACKGROUND OF THE INVENTION

The invention relates to thin film solar cells. More specifically, the invention relates to thin film amorphous silicon solar cells.

Photovoltaic cells are capable of converting solar radiation into usable electrical energy. The energy conversion occurs as a result of what is well known in the solar cell field as the photovoltaic effect. Solar radiation impinging on a solar cell is absorbed by the semiconductor layer, which generates holes and electrons. The electrons and holes are separated by a built in electric field, for example, a rectifying junction such as an NIP junction, in the solar cell. The electrons flow towards the N-type region and the holes flow towards the P-type region. The separation of the electrons and holes across the rectifying junction results in the generation of an electric current known as the photocurrent and an electric voltage known as the photovoltage.

Various types of solar cells are being actively researched to create devices which can effectively compete with conventionally generated forms of electricity. The research is focused on two main alternatives. One research area has focused on small area high efficiency single crystal silicon or III–V compound solar cells such as gallium arsenide. The III–V cells are used in conjunction with a concentrating lens. The other main research area has focused on inexpensive thin film solar devices such as $Cu_xS/CdS$ or hydrogenated amorphous silicon or hydrofluorinated amorphous silicon.

This invention focuses on thin film hydrogenated amorphous silicon solar cells. G. A. Swartz, *J. Appl. Phys.*, vol. 53(1), January 1982, pp 712–719, teaches that the major loss mechanism in an N+IP+ amorphous silicon solar cell is the back diffusion of holes into the thin N+-type region (the first letter, (N+), indicates the region through which solar radiation first penetrates the solar cell). More generally, this loss mechanism applies to any solar cell wherein the light first enters the cell through a region which ohmically contacts the top electrical contact. Thus, it would be highly desirable to have an amorphous silicon solar cell which incorporated a means for minimizing or eliminating the major loss mechanism and a method of reducing or eliminating the back diffusion of holes into the thin N+-type region of the solar cell.

SUMMARY OF THE INVENTION

I have invented a hydrogenated amorphous silicon solar cell which incorporates a thin insulating layer in the body of hydrogenated amorphous silicon between the doped incident region of the solar cell which ohmically contacts the incident electrode and the intrinsic (I) region, to suppress the back diffusion of holes from the incident region. My invention also provides for a method of reducing the back diffusion of holes from the incident region.

BRIEF DESCRIPTION OF THE DRAWINGS

FIG. 1 illustrates an NIP solar cell incorporating a thin insulating layer between the region of N-type amorphous silicon and the region of intrinsic amorphous silicon.

DETAILED DESCRIPTION OF THE INVENTION

The invention will be more clearly illustrated by referring to FIG. 1 which depicts an NIP solar cell designated as 10. The solar radiation 100, impinging on the solar cell 10, forms a reference point for the incident surface of each layer or region of the solar cell. The incident surface is defined as the major surface which is first incident to solar radiation. The opposed major surfaces and layer in which the solar radiation exits in passing to the next incident surface is defined to be the opposed major surface of the layer. The solar cell 10 includes an electrically conductive substrate 12 of stainless steel, molybdenum, titanium, or other suitable materials. Optionally, the substrate 12 may be glass coated with an electrically conductive material such as a transparent conductive electrode, hereafter referred to as TC, such as gold, silver or a transparent conductive oxide, TCO, such as tin oxide, indium tin oxide or like materials. Another option is the incorporation of a highly reflective layer of a metal such as aluminum or chromium on the substrate 12 to reflect light back into the semiconductor material.

The solar cell 10 incorporates a first amorphous silicon layer 14 of P-type conductivity and preferably P+-type conductivity contacting the substrate 12 and graded to a P-type conductivity in the direction away from the substrate 12. The P+-type conductivity ensures an ohmic contact to the substrate. The layer may be fabricated by glow discharge, sputtering, and the like. Glow discharging is the preferred method of fabrication. The layer has a thickness of about 10 to 50 nanometers, preferably 20–50 nanometers, and most preferably about 30 nanometers, with a bandgap energy of about 1.2–1.4 eV and a doping concentration of from about 25,000 to about 35,000 volume parts per million (Vol. ppm) and preferably about 30,000 vol. ppm of a suitable P-type dopant such as boron, gallium, aluminum, and the like. Preferably, the dopant is boron and is incorporated into the amorphous silicon through the use of the doping gas $B_2H_6$. Optionally, a wide bandgap energy material, i.e., 1.8–2.0 eV, can be fabricated by incorporating methane, ammonia, nitrogen or nitrous oxide along with the silane and P-type dopant.

Contacting the P-type layer 14 is a photoactive layer 16 of intrinsic amorphous silicon. Layer 16 has a thickness of from about 400 to about 1,000 nanometers and preferably about 500 nanometers, with a bandgap energy of about 1.7 eV or greater. The layer 16 is the layer of the solar cell wherein solar radiation is absorbed and creates the electrons and holes which are swept to the N-type and P-type layers, respectively.

A layer 18 of an insulating material such as $SiO_2$, $Si_3N_4$, BN, $Ta_2O_5$, $Nb_2O_5$, and the like contact the photoactive layer 16. The insulating layer 18 is from about 1 to 5 nanometers thick and preferably about 3 nanometers thick. Preferably, the insulating layer is $Si_3N_4$ or $SiO_2$ because said materials are easily fabricated in a glow discharge apparatus used to fabricate the amorphous silicon. The insulating layer suppresses the back diffusion of holes, which thereby increases the short circuit current $J_{sc}$, of the solar cell.

The insulator layer 18 is selected and/or adjusted so that the electron affinity of the insulator is the same as the semiconductor material and there is no impediment to the electric current flow. However, this insulator layer presents a barrier to the back diffusion of holes because of the wider bandgap energy of the insulator in comparison to the bandgap energy of the semiconductor. This suppression of the back diffusion of holes increases the quantum efficiency of the solar cell in the blue region of the solar spectrum. The thickness of the insulator layer is adjusted to maximize the quantum efficiency at the blue end of the AM1 excitation spectrum. Beyond this thickness, the overall quantum efficiency of the solar cell is decreased because the solar cell operates in a tunnel dominated regime rather than a semiconductor dominated regime.

A layer 20 of N-type amorphous silicon contacts the insulating layer 18. The layer 20 incorporates a suitable N-type dopant such as phosphorus, arsenic and the like in a concentration of from about 5,000 to about 15,000 and preferably about 10,000 Vol. ppm. The layer 20 has a thickness of from about 10–50 nanometers, preferably 20–50 nanometers, and most preferably about 25 nanometers. The layer 20 preferably has a bandgap energy of about 1.8 eV and is graded from N-type to N$^+$-type at the layers incident surface. The N$^+$-type conductivity ensures an ohmic contact to the incident electrode layer 22. Preferably the dopant is phosphorus and is incorporated into the layer through the use of the doping gas PH$_3$.

Contacting the layer 20 is a transparent conducting electrode layer 22 of a transparent conductive metal or oxide. The layer 22 forms the front electrode of solar cell 10. The layer 22 has a thickness of about 50 to about 100 nanometers with a conductivity of less than about 60 ohms/square ($\Omega/\square$), preferably less than about 30 $\Omega/\square$, and most preferably less than about 20 $\Omega/\square$. The actual thickness of layer 22 can be adjusted so that it can serve as an integral antireflection coating. As the area of the device increases, a grid electrode 24 can be incorporated into the device to withdraw the photogenerated current therefrom.

The solar cells can be fabricated by reactive sputtering or chemical vapor deposition of silicon or preferably by glow discharge of a siliconhydrogen or silicon-halogen-hydrogen-containing gas such as silane, dichlorosilane, difluorosilane, silicon tetrachloride and hydrogen gas, and the like. The solar cells can be fabricated by procedures taught in U.S. Pat. No. 4,064,521 and completely incorporated herein by reference or in accordance with the procedures outlined in U.S. Pat. No. 4,226,898, incorporated herein by reference for all purposes. Suitable glow discharge apparatus are commercially available, such as Model 2306 of Plasma Systems, Inc., a subsidiary of Plasma-Therm, Inc., Woburn, MA, Model PWS 450 Coyote, a product of Pacific Western Systems, Inc, Mountainview, CA, or Model PND-301-MQ(6), a product of LFE Corp., Waltham, MA.

For example, P-type or P$^+$-type hydrogenated amorphous silicon can be fabricated from SiH$_4$+B$_2$H$_6$, SiH$_4$+H$_2$+B$_2$H$_6$, SiF$_4$+H$_2$+B$_2$H$_6$, SiCl$_2$H$_2$+H$_2$+B$_2$H$_6$, the halogenated silicon gases plus hydrogen and a P-type dopant, and the like. Wide bandgap P-type material can be fabricated from SiH$_4$+CH$_4$+B$_2$H$_6$, SiH$_4$+N$_2$O+B$_2$H$_6$, SiH$_4$+NH$_3$+B$_2$H$_6$, the halogenated silicon gases and CH$_4$ or NH$_3$, and the like. Compensated intrinsic amorphous silicon can be fabricated from SiH$_4$+B$_2$H$_6$+PH$_3$, SiF$_4$+H$_2$+B$_2$H$_6$+PH$_3$, SiH$_4$+H$_2$+B$_2$H$_6$+PH$_3$, other halogenated silicon gases, hydrogen, diborane, phosphine, and the like. N-type or N$^+$-type material can be fabricated from the same materials as the P-type material; however, PH$_3$, AsH$_3$ or other suitable N-type dopant is substituted for the P-type dopant. Suitable substrate temperatures are from about 250°–350° C. with a power density of 0.2–2 w/cm$^2$, a flow rate of 5–50 SCCM and a deposition pressure of 0.1–2 torr.

More specifically, a conductive substrate such as stainless steel is placed in a glow discharge apparatus and the system is evacuated to a background pressure of about 10$^{-6}$ torr. Thereafter, the substrate is heated to a temperature of about 280° C. Silane or dichlorosilane and hydrogen are introduced into the chamber along with about 3 volume percent B$_2$H$_6$. The flow rate of the silane containing B$_2$H$_6$ is about 20 SCCM. Thereafter, the electrodes of the glow discharge apparatus are energized and about a 30 nanometer layer of P$^+$-type to P-type hydrogenated amorphous silicon is grown on the substrate. Optionally, CH$_4$ or N$_2$O gas can be included in the glow discharge atmosphere to widen the bandgap energy of the P-type material. The background pressure of the apparatus at this point and for subsequent depositions is about 0.5 torr.

After the growth of the P$^+$-type layer, the photoactive intrinsic region of the cell is fabricated by continuing the introduction of silane at a flow rate of about 20 SCCM with the B$_2$H$_6$ turned off until a layer about 500 nanometers thick of intrinsic hydrogenated amorphous silicon (uncompensated) is grown on the P$^+$-type layer.

Thereafter, the insulator layer is grown on the photoactive intrinsic layer by, for example, continuing the flow of silane while introducing ammonia in a ratio of 70% silane 30% ammonia to grow a layer about 3 nanometers thick of Si$_3$N$_4$. An appropriate flow rate for the silane is about 15 SCCM and for the ammonia is about 5 SCCM. During the growth process the surface substrate temperature is about 280° C.

Alternatively, the insulator could be fabricated of silicon dioxide SiO$_2$ through the introduction of silane and nitrous oxide N$_2$O.

The completion of the amorphous silicon part of the cell is completed by introducing silane with phosphine (PH$_3$) present in an amount from about 0.5 to 2% of the atmosphere, until about a 20 nanometer layer of N-type to N$^+$-type hydrogenated amorphous silicon is grown on the photoactive intrinsic layer. The substrate temperature is about 280° C. during the growth of this layer.

Thereafter, a transparent conductive oxide and if necessary, an ohmic grid contact is fabricated on the N$^+$-type layer by methods known in the art such as evaporation for the TCO layer and photolithographic techniques for the grid contact.

The incorporation of the insulating layer acts as a mirror to reflect the holes which would migrate into the incident N-type layer and combine with electrons and thereby reduce the efficiency of the device. Although I have described my invention for an NIP amorphous silicon solar cell, I do not intend to be limited to the specific teachings herein. The invention is equally applicable to improving the performance of amorphous silicon solar cells which incorporate a Schottky-barrier metal layer touching the intrinsic region wherein the insulating region would be placed between the photoactive intrinsic region and an incident N-type layer of the solar cell. In addition, the solar cell can include one or more cermet layers as taught in U.S. Pat. No. 4,162,505, incorporated herein by reference. The solar cell can also be fabricated as a solar battery type structure of a series of stacked solar cell structures, said solar cell structures separated by a tunnel junction, as disclosed in U.S. Pat. No. 4,316,049, also incorporated by reference. Modifications which would be obvious to one of ordinary skill in the art are contemplated to be within the scope of the invention.

What is claimed is:

1. In an hydrogenated amorphous silicon solar cell which comprises an electrically conductive substrate, a layer of hydrogenated amorphous silicon ohmically contacting said electrically conductive substrate and having regions of differing conductivity with at least one interface between an incident N-type or N+-type region of hydrogenated amorphous silicon and a photoactive region of intrinsic hydrogenated amorphous silicon, and means for electrically contacting said layer of hydrogenated amorphous silicon opposite to the side contacting said electrically conductive substrate, the improvement wherein the layer of hydrogenated amorphous silicon incorporates an insulator layer between said incident N-type or N+-type region and said photoactive intrinsic region wherein said insulator has a sufficient thickness to permit electrons to pass therethrough while reflecting holes back into the photoactive intrinsic region.

2. The solar cell according to claim 1 wherein the insulator layer is from about 2 to about 5 nanometers thick.

3. The solar cell according to claim 2 wherein the insulator is selected from the group consisting of $Si_3N_4$, $SiO_2$, BN, $Ta_2O_5$, $Nb_2O_5$.

4. The solar cell according to claim 3 wherein the insulator is $Si_3N_4$.

5. The solar cell according to claim 3 wherein the insulator is $SiO_2$.

6. The solar cell according to any one of claims 1, 2 or 3 wherein the cell has the structure of N-type amorphous silicon/insulator/photoactive intrinsic amorphous silicon/P-type amorphous silicon.

7. The solar cell according to claim 6 wherein the P-type region is from about 20 to about 50 nanometers in thickness, the photoactive intrinsic region is from about 400 to about 1,000 nanometers in thickness, and the N-type region is from about 20 to about 50 nanometers in thickness.

8. The solar cell according to claim 7 wherein a plurality of said structures are stacked, said structures are separated by a tunnel junction.

9. The solar cell according to any one of claims 1, 2 or 3 wherein the amorphous silicon incorporates a halogen therein.

10. The solar cell according to claim 3 wherein the photoactive region of intrinsic hydrogenated amorphous silicon is selected from the group consisting of compensated intrinsic amorphous silicon or intrinsic amorphous silicon.

11. A method of inhibiting the transfer of holes from a photoactive intrinsic region of hydrogenated amorphous silicon to an incident N-type region comprising: fabricating an insulator layer between said N-type region of hydrogenated amorphous silicon and said photoactive intrinsic region of amorphous silicon, said insulator layer being selected to have an electron affinity which is the same as the amorphous silicon and a thickness which maximizes the quantum efficiency of the amorphous silicon at the blue end of the AM1 excitation spectrum.

12. The method according to claim 11 wherein the insulator layer is from about 2 to about 5 nanometers in thickness.

13. The method according to claim 12 wherein the insulator is selected from the group consisting of $Si_3N_4$, $SiO_2$, BN, $Ta_2O_5$, and $Nb_2O_5$.

14. The method according to claim 13 wherein the insulator is $Si_3N_4$ which is fabricated by a glow discharge in an atmosphere comprising 70% $SiH_4$ and 30% $NH_3$ with a substrate temperature of about 300° C.

15. The method according to claim 13 wherein the insulator is $SiO_2$ which is fabricated by a glow discharge in a 50/50 mixture of $SiH_4$ and $NO_2$ with a substrate temperature of about 300° C.

16. The method according to claim 13 wherein the amorphous silicon is fabricated to incorporate a halogen therein.

* * * * *